United States Patent
Yagi

(10) Patent No.: US 10,560,084 B2
(45) Date of Patent: Feb. 11, 2020

(54) LEVEL SHIFT CIRCUIT

(71) Applicant: Toshiba Memory Corporation, Minato-ku (JP)

(72) Inventor: Toshihiro Yagi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/123,266

(22) Filed: Sep. 6, 2018

(65) Prior Publication Data

US 2019/0081622 A1 Mar. 14, 2019

(30) Foreign Application Priority Data

Sep. 8, 2017 (JP) .................................. 2017-173477
Mar. 16, 2018 (JP) .................................. 2018-049762

(51) Int. Cl.
| | | |
|---|---|---|
| *H03K 17/0412* | (2006.01) | |
| *H03K 3/356* | (2006.01) | |
| *H03K 19/017* | (2006.01) | |
| *H03K 19/0185* | (2006.01) | |

(52) U.S. Cl.
CPC ... *H03K 17/04123* (2013.01); *H03K 3/35613* (2013.01); *H03K 19/01721* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 5,929,688 A | * | 7/1999 | Ueno | ............... H03K 3/356113 327/333 |
| 6,002,290 A | | 12/1999 | Avery et al. | |
| 7,005,889 B2 | * | 2/2006 | Sowden | ............... G06F 1/3203 326/81 |
| 7,026,855 B2 | | 4/2006 | Sueoka et al. | |
| 7,148,735 B2 | | 12/2006 | Ito et al. | |
| 7,795,916 B2 | | 9/2010 | Aoki | |
| 7,863,963 B2 | * | 1/2011 | Zhang | ............... H03K 3/356113 327/333 |

(Continued)

FOREIGN PATENT DOCUMENTS

| | | |
|---|---|---|
| JP | 3504172 | 3/2004 |
| JP | 3884439 | 2/2007 |

(Continued)

*Primary Examiner* — Cassandra F Cox
(74) *Attorney, Agent, or Firm* — Oblon, McClelland, Maier & Neustadt, L.L.P.

(57) ABSTRACT

According to one embodiment, in a level shift circuit, a first PMOS transistor is electrically connected at a gate to a first node to which a first signal having an amplitude to be a first power-supply potential is input, is electrically connected to a second node at a source, and is electrically connected at a drain to an output terminal from which a signal having an amplitude to be a second power-supply potential is output. The first NMOS transistor is electrically connected to the first node at a gate and is electrically connected to the output terminal at a drain. The second PMOS transistor is electrically connected to a node to be the second power-supply potential at a source, and is electrically connected to the second node at a drain. The potential adjusting circuit is electrically connected to at least the second node.

17 Claims, 14 Drawing Sheets

(56) References Cited

U.S. PATENT DOCUMENTS

| | | | |
|---|---|---|---|
| 7,924,080 B2 | 4/2011 | Uchino et al. | |
| 7,952,389 B2 | 5/2011 | Aoki | |
| 8,339,177 B2* | 12/2012 | Jarrar | H03K 19/018521 326/62 |
| 8,816,720 B2* | 8/2014 | Kim | H03K 19/017509 326/63 |
| 10,243,563 B2* | 3/2019 | Bonetti | H03K 19/21 |
| 10,256,796 B2* | 4/2019 | Hsin | H03K 3/35625 |
| 2007/0290735 A1* | 12/2007 | Ali | H03K 3/012 327/333 |
| 2009/0134929 A1* | 5/2009 | Luo | H03K 3/012 327/333 |
| 2010/0052763 A1* | 3/2010 | Chaba | H03K 3/012 327/333 |
| 2010/0085079 A1* | 4/2010 | Campbell | H03K 3/012 326/68 |
| 2010/0295596 A1* | 11/2010 | Aoki | H03K 3/35613 327/333 |
| 2011/0043268 A1* | 2/2011 | Huang | H03K 19/018521 327/333 |
| 2014/0253201 A1* | 9/2014 | Jung | H03K 3/356104 327/291 |
| 2015/0303921 A1* | 10/2015 | Jung | H03K 19/018521 327/333 |
| 2018/0302066 A1* | 10/2018 | Chen | H03K 19/018521 |

FOREIGN PATENT DOCUMENTS

| | | |
|---|---|---|
| JP | 4002847 | 11/2007 |
| JP | 2009-177280 | 8/2009 |
| JP | 4724578 | 7/2011 |
| JP | 5198309 | 5/2013 |
| JP | 5203791 | 6/2013 |
| JP | 5643158 | 12/2014 |

* cited by examiner

LEVEL SHIFT CIRCUIT

CROSS-REFERENCE TO RELATED APPLICATIONS

This application is based upon and claims the benefit of priority from Japanese Patent Application No. 2017-173477, filed on Sep. 8, 2017 and Japanese Patent Application No. 2018-049762, filed on Mar. 16, 2018; the entire contents of all of which are incorporated herein by reference.

FIELD

Embodiments described herein relate generally to a level shift circuit.

BACKGROUND

A level shift circuit is used for a transmitting and receiving method of which receiving performance is affected by data to be transmitted or a duty of a clock.

DETAILED DESCRIPTION

In general, according to one embodiment, there is provided a level shift circuit including a first PMOS transistor, a first NMOS transistor, a second PMOS transistor, a third PMOS transistor, a second NMOS transistor, a fourth PMOS transistor, and a potential adjusting circuit. The first PMOS transistor is electrically connected at a gate to a first node to which a first signal having an amplitude to be a first power-supply potential is input, electrically connected to a second node at a source, and electrically connected at a drain to an output terminal from which a signal having an amplitude to be a second power-supply potential different from the first power-supply potential is output. The first NMOS transistor is electrically connected to the first node at a gate and is electrically connected to the output terminal at a drain. The second PMOS transistor is electrically connected to a third node at a gate, electrically connected to a node to be the second power-supply potential at a source, and electrically connected to the second node at a drain. The third PMOS transistor is electrically connected at a gate to a fourth node to which a second signal having an amplitude to be the first power-supply potential and being logical inversion of the first signal is input, electrically connected to a fifth node at a source, and electrically connected to the third node at a drain. The second NMOS transistor is electrically connected to the fourth node at a gate and electrically connected to the third node at a drain. The fourth PMOS transistor is electrically connected to the output terminal at a gate, electrically connected to the node to be the second power-supply potential at a source, and electrically connected to the fifth node at a drain. The potential adjusting circuit is electrically connected to at least the second node.

Exemplary embodiments of a level shift circuit will be explained below in detail with reference to the accompanying drawings. The present invention is not limited to the following embodiments.

(First Embodiment)

A level shift circuit 1 according to a first embodiment will be described. The level shift circuit 1 shifts a level of a signal input thereinto to a particular level, and outputs the shifted signal. To achieve a stable initial operation of a circuit of an output destination, it is preferable that an initial operation of the level shift circuit 1 is made stable.

Figure 1:
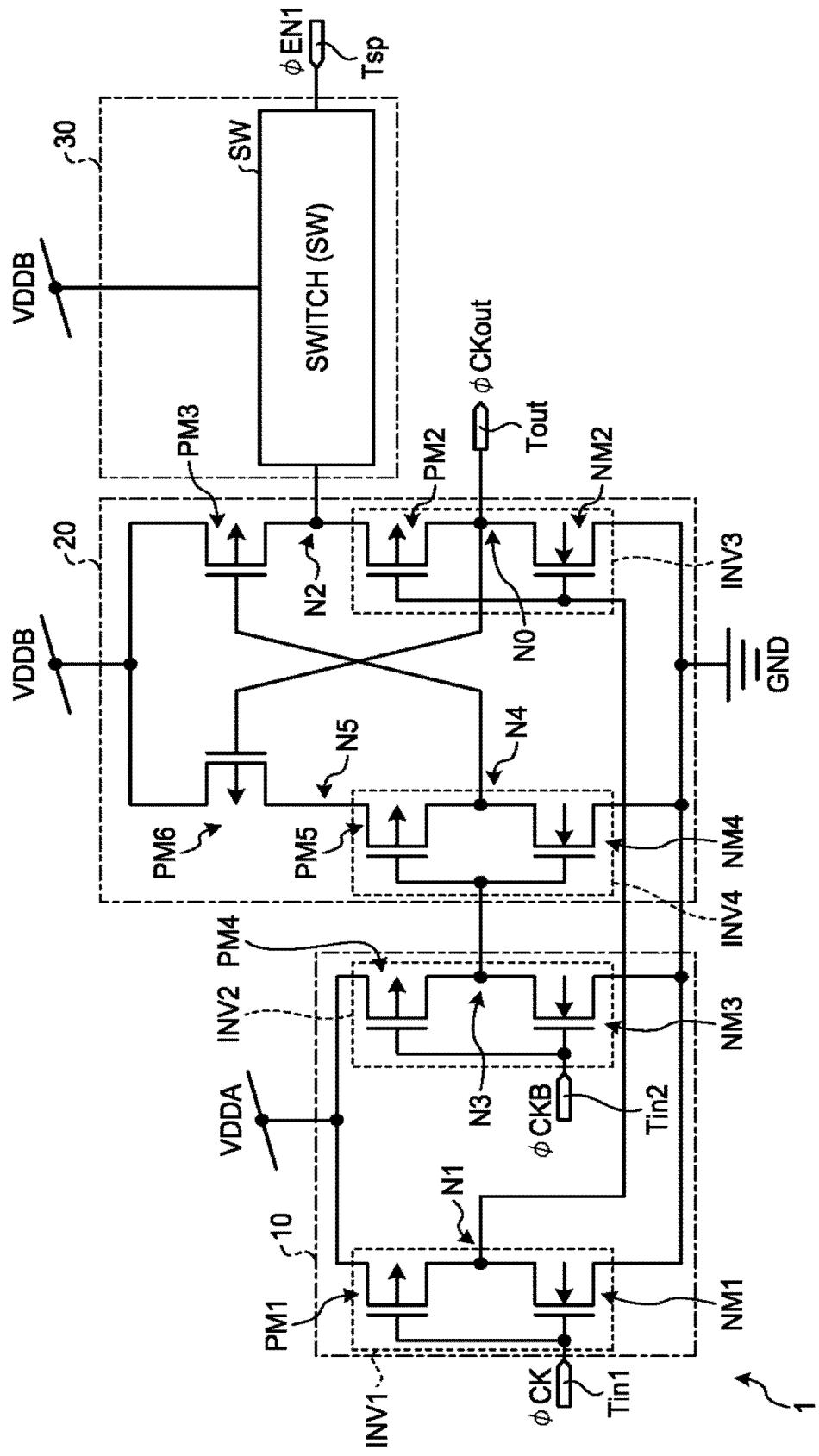
FIG. 1 is a circuit diagram illustrating a configuration of a level shift circuit according to a first embodiment.

The level shift circuit 1 is configured as illustrated in FIG. 1, for example. FIG. 1 is a circuit diagram illustrating a configuration of the level shift circuit 1. The level shift circuit 1 includes an input buffer 10 and a level shifter 20.

The input buffer 10 is configured to have a differential input and a differential output, and includes a positive-side inverter INV1 and a negative-side inverter INV2. The inverter INV1 and the inverter INV2 are connected in parallel between a power-supply potential VDDA and a ground potential GND.

The inverter INV1 includes a PMOS transistor PM1 and an NMOS transistor NM1. The PMOS transistor PM1 is electrically connected to an input terminal Tin1 at a gate, to the power-supply potential VDDA at a source, and to a node N1 at a drain. The NMOS transistor NM1 is electrically connected to the input terminal Tin1 at a gate, to the ground potential GND at a source, and to the node N1 at a drain. That is, the drain of the PMOS transistor PM1 and the drain of the NMOS transistor NM1 are electrically connected.

The inverter INV2 includes a PMOS transistor PM4 and an NMOS transistor NM3. The PMOS transistor PM4 is electrically connected to an input terminal Tin2 at a gate, to the power-supply potential VDDA at a source, and to a node N3 at a drain. The NMOS transistor NM3 is electrically connected to the input terminal Tin2 at a gate, to the ground potential GND at a source, and to the node N3 at a drain. That is, the drain of the PMOS transistor PM4 and the drain of the NMOS transistor NM3 are electrically connected.

The level shifter 20 is configured to have a differential input and a single output, and includes a PMOS transistor PM6, an inverter INV4, a PMOS transistor PM3, and an inverter INV3. A configuration in which the PMOS transistor PM6 and the inverter INV4 are connected in series and a configuration in which the PMOS transistor PM3 and the inverter INV3 are connected in series are connected in parallel between a power-supply potential VDDB and the ground potential GND. The power-supply potential VDDB is different from the power-supply potential VDDA. Further, the PMOS transistor PM6 and the inverter INV3, and the PMOS transistor PM3 and the inverter INV4 are cross-coupling connected.

The PMOS transistor PM6 is electrically connected to a node N0 of the inverter INV3 at a gate, to the power-supply potential VDDB at a source, and to a node N5 of the inverter INV4 at a drain.

The inverter INV4 includes a MOS transistor PM5 and an NMOS transistor NM4. The PMOS transistor PM5 is electrically connected to the node N3 of the inverter INV2 at a gate, to the node N1 at a source, and to a node N4 at a drain. The NMOS transistor NM4 is electrically connected to the node N3 of the inverter INV2 at a gate, to the ground potential GND at a source, and to the node N4 at a drain. That is, the drain of the PMOS transistor PM5 and the drain of the NMOS transistor NM4 are electrically connected.

The PMOS transistor PM3 is electrically connected to the node N4 of the inverter INV4 at a gate, to the power-supply potential VDDB at a source, and to a node N2 of the inverter INV3 at a drain.

The inverter INV3 includes a PMOS transistor PM2 and an NMOS transistor NM2. The PMOS transistor PM2 is electrically connected to the node N1 of the inverter INV1 at a gate, to the node N2 at a source, and to the node N0 at a drain. The NMOS transistor NM2 is electrically connected to the node N1 of the inverter INV1 at a gate, to the ground potential GIN at a source, and to the node N0 at a drain. The node N0 is electrically connected to an output terminal Tout. That is, the drain of the PMOS transistor PM2 and the drain of the NMOS transistor NM2 are electrically connected.

In the input buffer 10 in the level shift circuit 1, the inverter INV1 outputs a signal obtained by logically inverting a clock φCK input to the input terminal Tin1, as a voltage signal $V_{N1}$ from the node N1. The inverter INV2 outputs a signal obtained by logically inverting a clock φCKB input to the input terminal Tint, as a voltage signal $V_{N3}$ from the node N3. The clock φCKB is logical inversion of the clock φCK, and the voltage signal $V_{N3}$ is logical inversion of the voltage signal $V_{N1}$ (see FIG. 3).

The level shifter 20 converts an H level of each of the clocks φCK and φCKB received in a differential manner from a level corresponding to the power-supply potential VDDA to a level corresponding to the power-supply potential VDDB by cross-coupling connection between the PMOS transistor PM6 and the inverter INV3, and the PMOS transistor PM3 and the inverter INV4. At this time, this conversion can be performed at a high speed by setting connecting partners in cross-coupling connection of the PMOS transistor PM6 and the PMOS transistor PM3 to the inverters INV3 and INV4, not transistors, respectively. The level shifter 20 outputs a clock φCKout after conversion from the output terminal Tout.

The level shift circuit 1 is used in a case of converting a signal level (VDDA) of a signal processing circuit to a signal level (VDDB) of an interface at a high speed, for example. At this time, in a transmitting and receiving method of which receiving performance is affected by a duty of the first clock and duties of subsequent clocks, it is preferable that the duties are 50%.

However, in the level shift circuit 1, when a state where there is no transition of a signal level of each of the input clocks φCK and φCKB (a coarse state) is rapidly changed to a state where a transition of a signal level of each of the clocks φCK and φCKB occurs (a fine state), the duty of the first clock of the output clock φCKout is varied by a voltage condition.

This variation is caused because a potential at the node N2 in the level shift circuit 1 is unstable. For example, assuming that a threshold voltage of the PMOS transistor PM2 is VthP, in a case where "power-supply potential VDDA<power-supply potential VDDB" and "VDDB-VDDA<VthP" are established, the PMOS transistor PM2 receiving at its gate the clock φCK, which is at an H level in an initial state, is in an off state because a potential difference between the gate and the source is not sufficiently secured, so that the node N2 is in a high-impedance state.

Therefore, at a timing of a transition of the clock φCK from an L level to an H level (at a time at which an operation starts), in a case where the potential at the node N2 is unstable and is around 0 V, for example, there is a tendency that the output clock φCKout does not rise immediately but rises at a timing that is delayed by a time required for charging the node N2. Therefore, an H-pulse width is reduced in the first period (the first clock) of the output clock φCKout, and the duty is reduced in accordance with the reduction of the H-pulse width. Consequently, it is likely that a set-up time or a holding time in a case of latching data in the first clock by a circuit as an output destination, for example, is not sufficiently secured, resulting in latch of an incorrect data value.

Accordingly, in the present embodiment, a charging circuit (a potential adjusting circuit) 30 that can charge the node N2 immediately before a timing at which a data transition of the output clock φCkout is to be performed is provided, thereby improving the duty of the first clock of the output clock φCKout.

Specifically, the level shift circuit 1 further includes the charging circuit 30, as illustrated in FIG. 1. The charging circuit 30 is electrically connected to the node N2 of the level shifter 20. The charging circuit 30 includes a switch SW. The switch SW is electrically inserted between the power-supply potential VDDB and the node N2. A control node of the switch SW is electrically connected to a control terminal Tsp. The switch SW is turned on and off in accordance with a control signal φEN1 received at its control node via the control terminal Tsp. The switch SW connects the power-supply potential VDDB to the node N2 by being turned on, and electrically disconnects the power-supply potential VDDB from the node N2 by being turned off.

Figure 2:
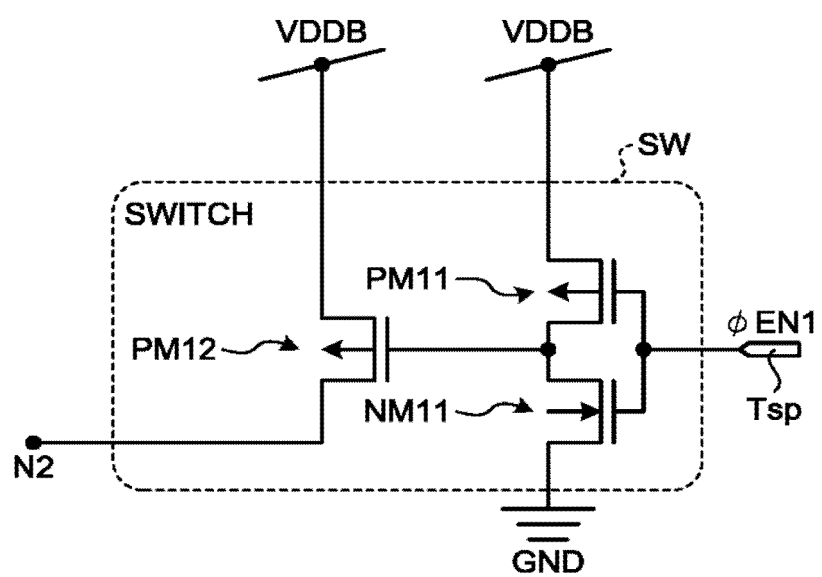
FIG. 2 is a diagram illustrating a configuration example of a switch according to the first embodiment.

The switch SW is configured as illustrated in FIG. 2, for example. FIG. 2 is a diagram illustrating a configuration example of the switch W. The switch SW includes a PMOS transistor PM11, an NMOS transistor NM11, and a PMOS transistor PM12. The PMOS transistor PM11 and the NMOS transistor NM11 are inverter-connected between the power-supply potential VDDB and the ground potential GND, the control terminal Tsp is connected to each of gates of the transistors in common, and a gate of the PMOS transistor PM12 is connected to each of drains of the transistors in common. A source of the PMOS transistor PM11 is electrically connected to the power-supply potential VDDB. A source of the NMOS transistor NM11 is electrically connected to the ground potential GND. The PMOS transistor PM12 is electrically connected to the power-supply potential VDDB at a source and to the node of the level shifter 20 at a drain.

Figure 3:
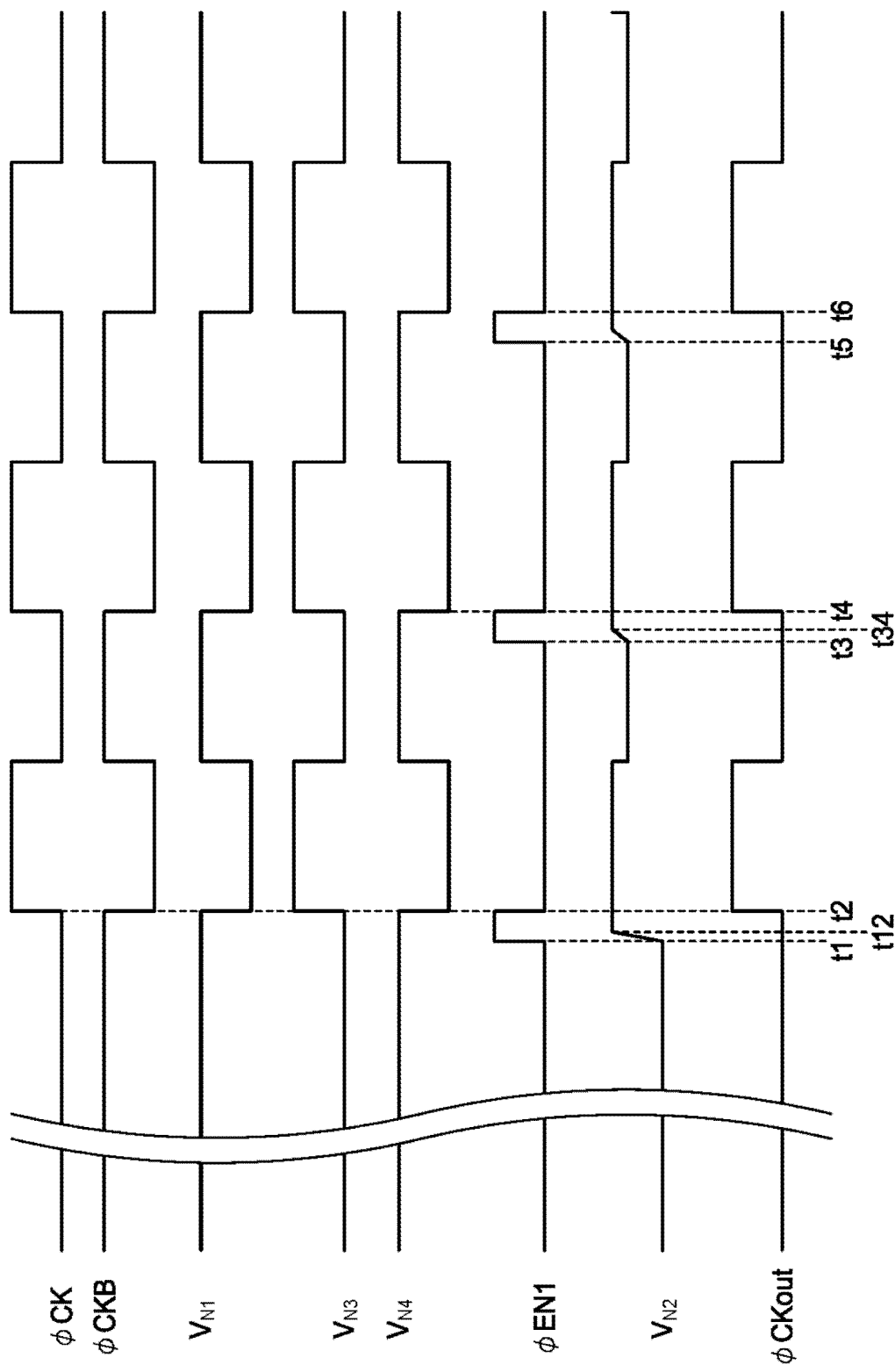
FIG. 3 is a waveform chart illustrating an operation example of the level shift circuit according to the first embodiment.

The level shift circuit 1 including the charging circuit 30 operates as illustrated in FIG. 3, for example. FIG. 3 is a waveform chart illustrating an operation example of the level shift circuit 1.

At a timing t1 immediately before a rising timing t2 of the first clock of the input clock φCK, the control signal φEN1 transitions from an L level to an H level. Consequently, the switch SW in the charging circuit 30 is turned on and charges the node N2, so that a potential $V_{N2}$ at the node N2 rises from an L level to an H level and is stable at the H level after a timing t12. The H level is VDDB.

At the timing t2, the control signal φEN1 transitions from the H level to the L level and the node N2 is electrically disconnected from the power-supply potential VDDB. However, because the potential $V_{N2}$ at the node N2 has already become stable at the H level, rising of the output clock φCKout can be made quicker when the clock φCK transitions from an L level to an H level. Consequently, the duty of the first clock of the output clock φCKout can be improved.

Thereafter, the potential $V_{N2}$ at the node N2 can be attenuated to an intermediate level (between the L level and the H level) by leak, a gate voltage value, or the like of the PMOS transistor PM2. However, the control signal φEN1 transitions from the L level to the H level again at a timing t3 immediately before a rising timing t4 of the second clock of the clock φCK. Therefore, the switch SW in the charging circuit 30 is turned on and charges the node N2, so that the potential $V_{N2}$ at the node N2 rises from the intermediate level to the H level again and is stable at the H level after a timing t34.

At the timing t4, the control signal φEN1 transitions from the H level to the L level and the node N2 is electrically disconnected from the power-supply potential VDDB. However, because the potential $V_{N2}$ at the node N2 has already become stable at the H level, rising of the output clock φCKout can be made quicker when the clock φCK transitions from the L level to the H level. Consequently, the duty of the second clock of the output clock φCKout can be also improved.

An operation for the third clock and subsequent clocks of the clock φCK (for example, an operation at timings from t5 to t6) is identical to the operation for the second clock of the clock φCK (that is, the operation at timings from t1 to t4). Further, potentials $V_{N1}$, $V_{N3}$, and $V_{N4}$ at the nodes N1, N3, and N4 are changed in a stable manner, as illustrated in FIG. 3.

As described above, the charging circuit 30 that can charge the node N2 immediately before a timing at which a data transition of the output clock φCKout is to be performed is provided in the embodiment. Therefore, the duty of the first clock and duties of subsequent clocks of the output clock φCKout can be improved.

Further, the charging circuit 30 includes the switch SW electrically inserted between the power-supply potential VDDB and the node N2 in the embodiment. Therefore, the charging circuit 30 can be achieved with a simple configuration.

The switch SW can be incorporated in the level shift circuit 1. With this configuration, a parasitic capacitance value of the switch SW can be reduced, so that a parasitic capacitance of the node N2 can be reduced.

Alternatively, an improvement for reducing power consumption can be made to a level shift circuit 1i. In FIG. 3, the potential $V_{N2}$ at the node N2 hardly becomes unstable in the second clock and subsequent clocks of the clock φCK as compared to the part immediately before the first clock of the clock φCK. Therefore, it is considered that, even by configuring the switch SW to be selectively turned on immediately before the first clock of the clock φCK, it is possible to make the potential $V_{N2}$ at the node N2 sufficiently stable.

Figure 4:
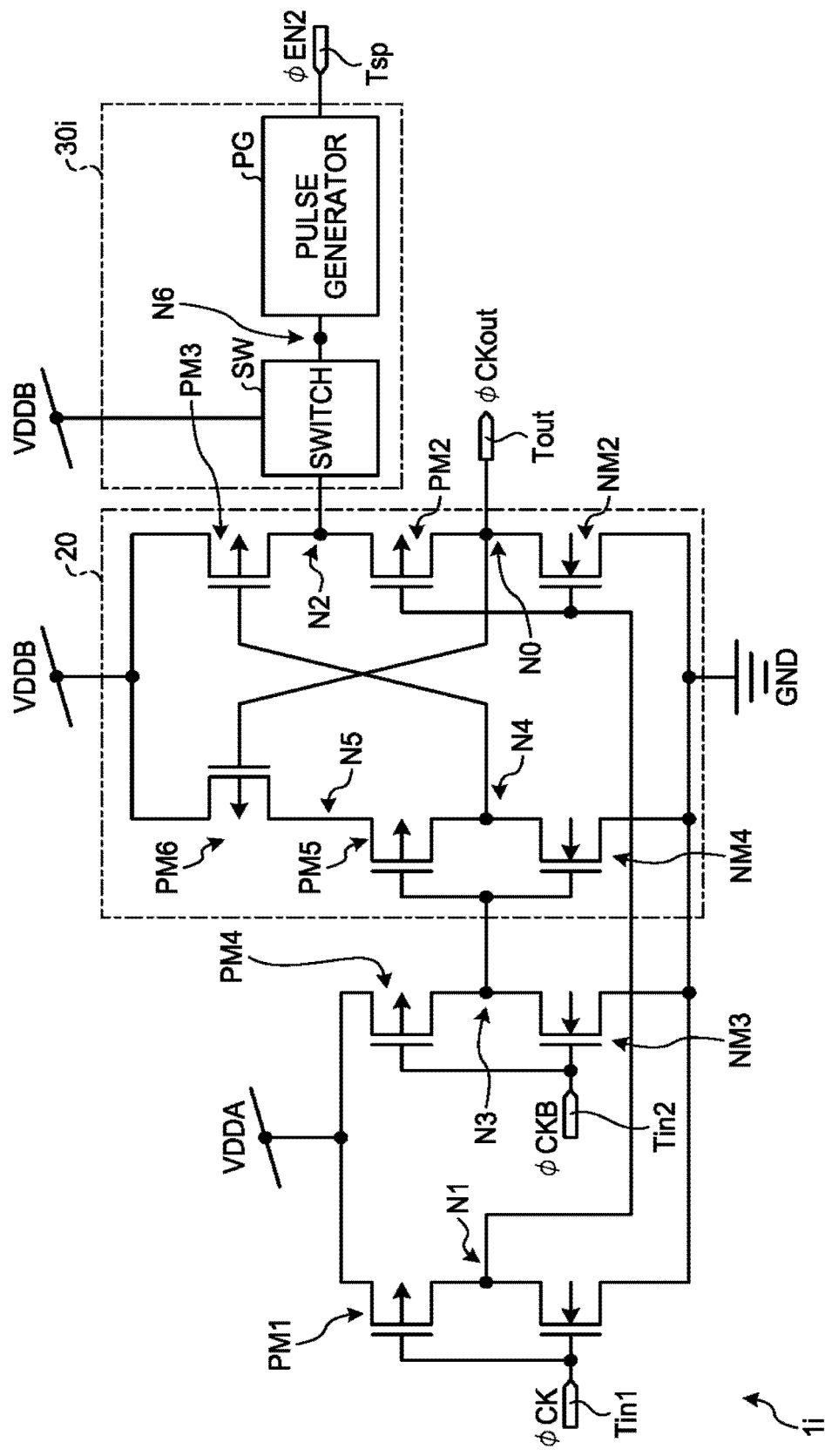
FIG. 4 is a circuit diagram illustrating a configuration of a level shift circuit according to a second embodiment.

Based on this concept, the level shift circuit 1i can be configured as illustrated in FIG. 4, for example. FIG. 4 is a diagram illustrating a configuration of the level shift circuit 1i according to a second embodiment. The level shift circuit 1i includes a charging circuit 30i in place of the charging circuit 30 (see FIG. 1). The charging circuit 30i further includes a pulse generator PG. The pulse generator PG is electrically inserted between the control terminal Tsp and the switch SW. The pulse generator PG generates a pulse (one pulse) by using a control signal φEN2 received via the control terminal Tsp, and supplies the pulse to a control node of the switch SW via a node N6.

Figure 5:
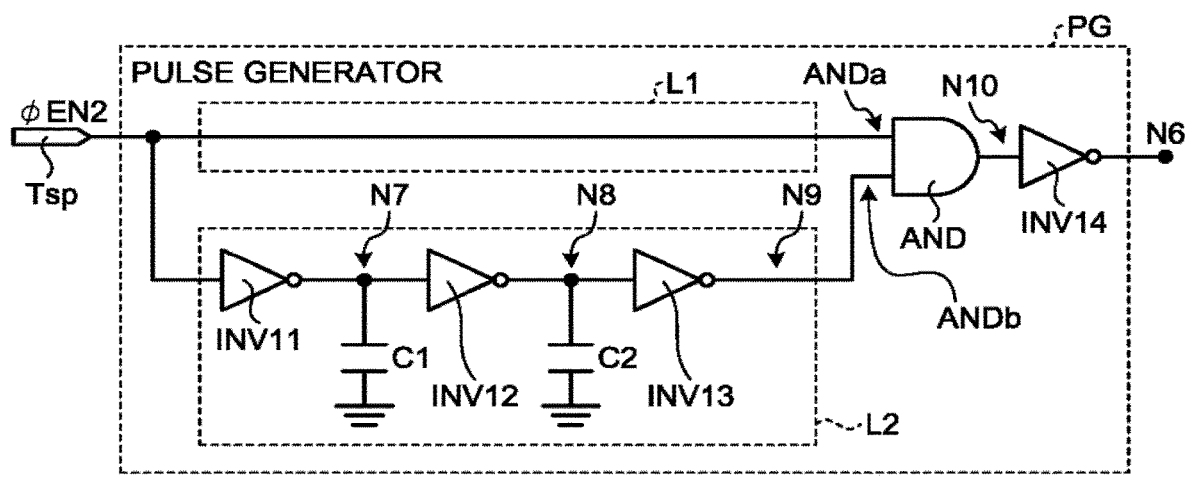
FIG. 5 is a circuit diagram illustrating a configuration of a pulse generator according to the second embodiment.

For example, the pulse generator PG is configured as a circuitry as illustrated in FIG. 5, for example. FIG. 5 is a diagram illustrating a configuration of the pulse generator PG according to the second embodiment. The pulse generator PG includes a line L1, a delay line L2, an AND gate AND, and an inverter INV14. The AND gate AND includes an input node ANDa and an input node ANDb. The line L1 is electrically connected between the control terminal Tsp and the input node ANDa. The delay line L2 is electrically connected between the control terminal Tsp and the input node ANDb. The delay line L2 includes inverters INV11 to INV13 and capacitance elements C1 and C2, and delays the control signal φEN2 by using the inverters INV11 to INV13 and the capacitance elements C1 and C2.

In a state where the control signal φEN2 is at an H level, the pulse generator PG obtains a logical product of the control signal φEN2 transmitted by the line L1 with almost no delay and the control signal φEN2 delayed by the delay line L2 by the AND gate AND, and logically inverts the logical product by the inverter INV14, thereby generating a pulse (one pulse).

Figure 6:
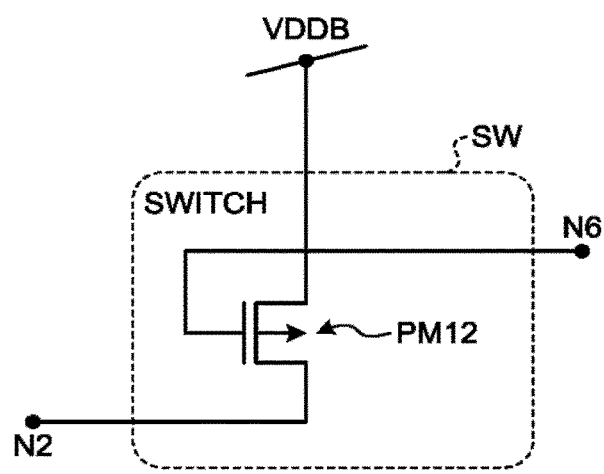
FIG. 6 is a circuit diagram illustrating a configuration a switch according to the second embodiment.

The configuration of the switch SW can be simplified as illustrated in FIG. 6. FIG. 6 is a diagram illustrating a configuration of the switch SW according to the second embodiment. That is, the switch SW can have a configuration in which the PMOS transistor PM11 and the NMOS transistor NM11 are omitted from the configuration illustrated in FIG. 2 and the PMOS transistor PM12 operates alone as illustrated in FIG. 6.

Figure 7:
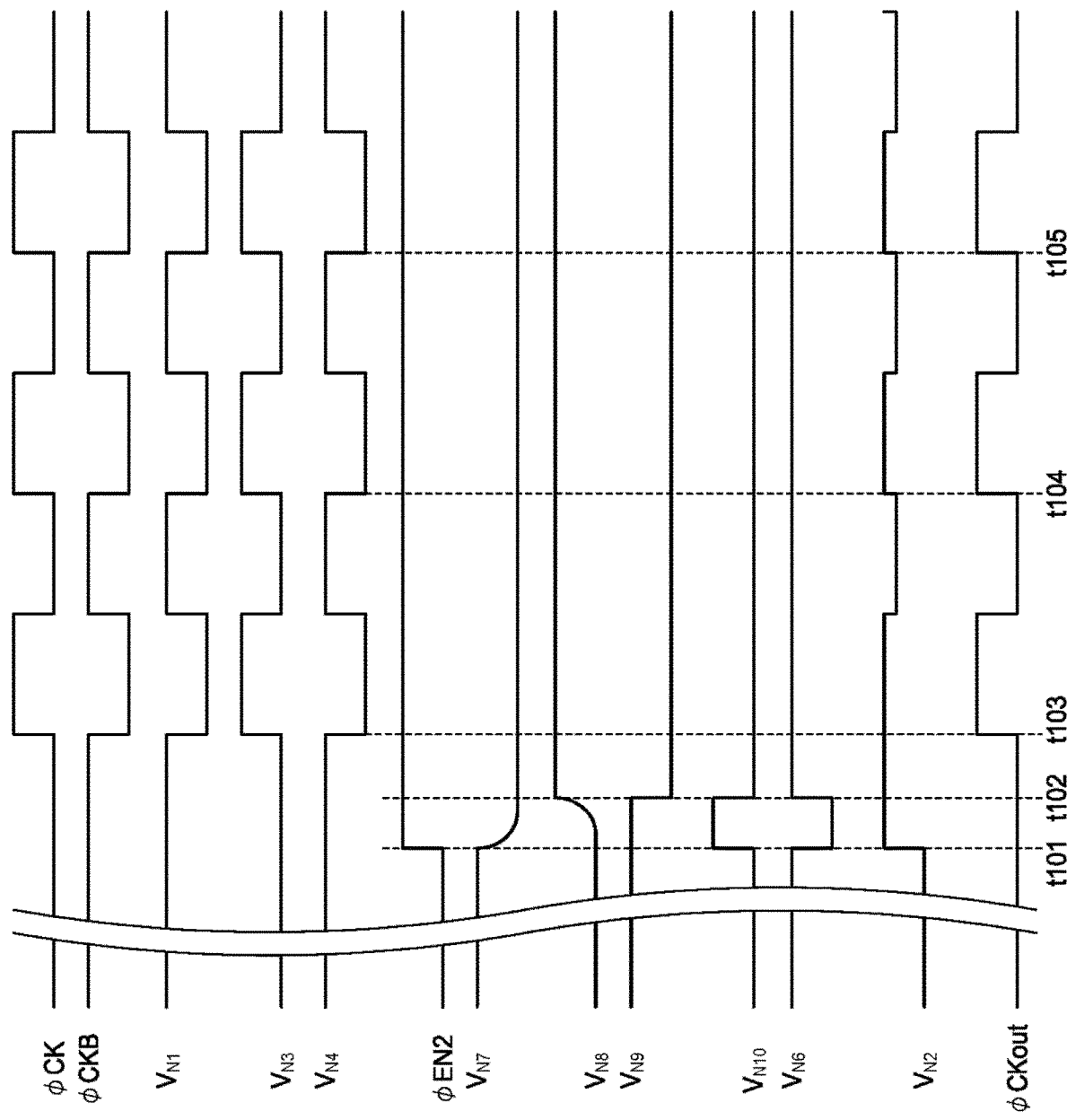
FIG. 7 is a waveform chart illustrating an operation example of the level shift circuit according to the second embodiment.

At this time, the level shift circuit 1i operates as illustrated in FIG. 7, for example. FIG. 7 is a waveform chart illustrating an operation of the level shift circuit 1i according to the second embodiment.

At a timing t101, the control signal φEN2 changes from an L level to an H level. After the timing t101, the control signal φEN2 is fixed at the H level. Therefore, in the pulse generator PG, a potential $V_{N7}$ at a node N7 (see FIG. 5) falls from an H level to an L level, and a potential $V_{N8}$ at a node N6 (see FIG. 5) rises from an L level to an H level. In accordance with this change, at a timing t102 that is delayed from the timing t101, a potential $V_{N9}$ at a node N9 (see FIG. 5) transitions from an H level to an L level, and as a result of a logical product of the level of the control signal φEN2 and the potential $V_{N9}$ and a logical inversion of the logical product, a waveform of a potential $V_{N6}$ at the node N6 can be made a pulse-like waveform that is low-active.

Therefore, it is possible to selectively turn on the switch SW in a time period from the timing t1 to the timing t102 immediately before a rising timing t103 of the clock φCK. That is, the number of turning-on operations of the switch SW after level change of the control signal φEN2 can be reduced to one (the switch SW is turned on immediately before the rising timing t103 in the first clock, but is not turned on immediately before rising timings t104, t105, and the like in the second clock and subsequent clocks), and therefore power consumption of the level shift circuit 1i can be reduced easily.

Figure 8:
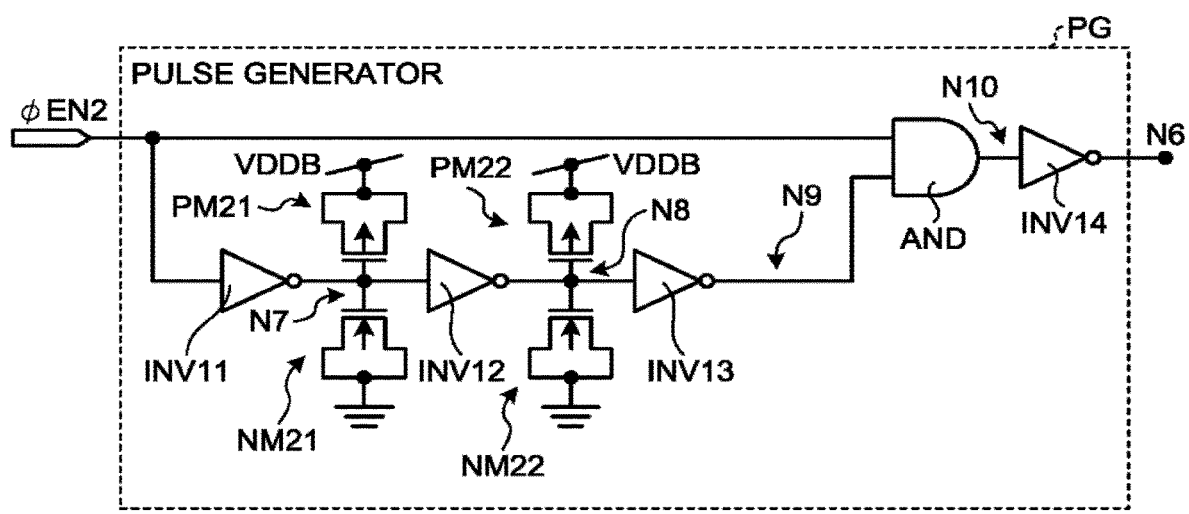
FIG. 8 is a circuit diagram illustrating a configuration of a pulse generator according to a third embodiment.

Alternatively, as illustrated in FIG. 8, the capacitance elements C1 and C2 in the pulse generator PG can be replaced with PMOS transistors PM21 and PM22 and NMOS transistors NM21 and NM22. FIG. 6 is a circuit diagram illustrating a configuration of the pulse generator PG according to a third embodiment. In this configuration, one of the PMOS transistors PM21 and PM22 and the NMOS transistors NM21 and NM22 can be omitted.

In the PMOS transistor PM21, a source and a drain are electrically connected to the power-supply potential VDDB in common, and a gate is electrically connected to the node N7. The PMOS transistor PM21 can serve as a capacitance element equivalently. In the NMOS transistor NM21, a source and a drain are electrically connected to the ground potential GND in common, and a gate is electrically connected to the node N7. The NMOS transistor NM21 can serve as a capacitance element equivalently. In the PMOS transistor PM22, a source and a drain are electrically connected to the power-supply potential VDDB in common, and a gate is electrically connected to the node N8. The PMOS transistor PM22 can serve as a capacitance element equivalently. In the NMOS transistor NM22, source and a drain are electrically connected to the ground potential GND in common, and a gate is electrically connected to the node N0. The NMOS transistor NM22 can serve as a capacitance element equivalently. Therefore, a layout area of the pulse generator PG can be reduced, as compared with a case where the pulse generator PG is configured by using the capacitance elements C1 and C2 in the second embodiment.

Alternatively, a configuration for further improving duty precision of a clock can be provided in a level shift circuit 1j. As illustrated in FIG. 3, charging (temporary pulling-up of a potential to an H level) by the charging circuit 30 is stopped at the timing t2. Therefore, the potential $V_{N2}$ at the node N2 can be attenuated to an intermediate level (between an L level and an H level) after the timing t2. However, when pulling-up of the potential $V_{N2}$ at the node N2 to the H level is continued also after the timing t2, it is possible to suppress attenuation to the intermediate level, make the potential at the node N2 stable also in the first clock and the subsequent clocks as in the first clock, and make rising of the clock φCKout quicker. Accordingly, it can be considered that precision of the duty of the first clock and the duties of the subsequent clocks of the output clock φCKout can be further improved.

Figure 9:
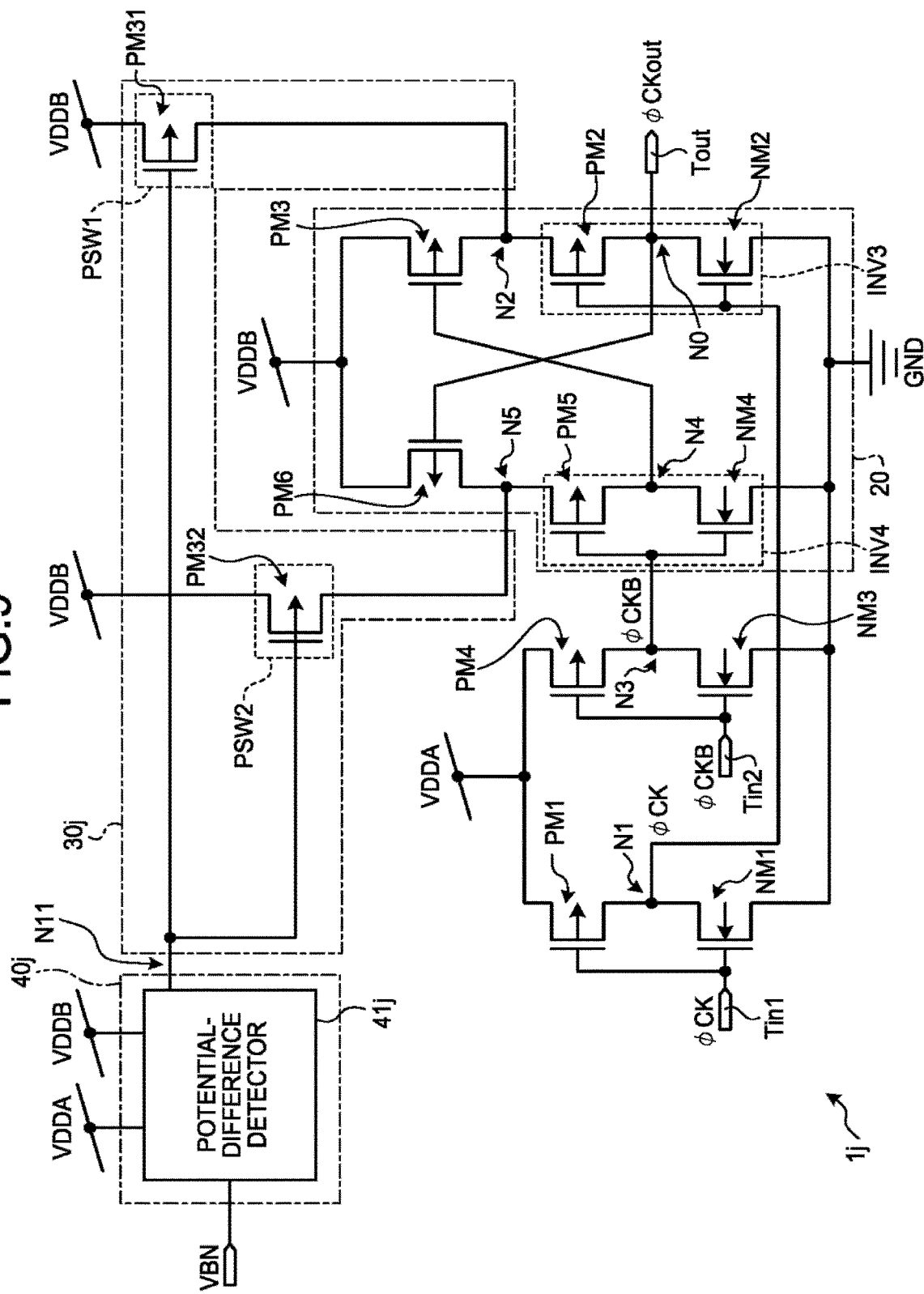
FIG. 9 is a circuit diagram illustrating a configuration of a level shift circuit according to a fourth embodiment.

Based on this concept, the level shift circuit 1j can be configured as illustrated in FIG. 9, for example. FIG. 9 is a diagram illustrating a configuration of the level shift circuit 1j according to a fourth embodiment. The level shift circuit 1j includes a pull-up circuit (a potential adjusting circuit) 30j in place of the charging circuit 30 (see FIG. 1). The pull-up circuit 30j can pull up the potential $V_{N2}$ at the node N2 continuously from before the first clock of the clock φCK. The pull-up circuit 30j is electrically connected to the node N2. The pull-up circuit 30j includes a pull-up switch PSW1 including a PMOS transistor PM31. The PMOS transistor PM31 is electrically inserted between the power-supply potential VDDB and the node N2. The PMOS transistor PM31 is electrically connected to a node N11 at a gate, to the power-supply potential VDDB at a source, and to the node N2 at a drain.

The pull-up circuit 30j is also electrically connected to the node N5, considering a circuit balance. The pull-up circuit 30j further includes a pull-up switch PSW2 including a PMOS transistor PM32. The PMOS transistor PM32 is electrically inserted between the power-supply potential VDDB and the ode N5. The PMOS transistor PM32 is electrically connected to the node N11 at a gate, to the power-supply potential VDDB at a source, and to the node N5 at a drain.

In addition, there may be a plurality of voltage conditions for the power-supply potential VDDA and the power-supply potential VDDB. For example, assuming that a threshold voltage of the PMOS transistor PM2 is VthP, in a case where "power-supply potential VDDA<power-supply potential VDDB" and "VDDB-VDDA<VthP" are established, the PMOS transistor PM2 receiving at its gate the voltage signal $V_{N1}$ (see FIG. 11), which is at an H level in an initial state, is in an off state because a potential difference between the gate and the source is not sufficiently secured, so that the node N2 is in a high-impedance state. Meanwhile, in a case where "power-supply potential VDDA<power-supply potential VDDB" and "VDDB-VDDA>VthP" are established, the PMOS transistor PM2 is in an on state because the potential difference between the gate and the source is sufficiently secured, so that the node N2 is at a stable potential. That is, it is possible to improve duty precision of a clock by switching whether to pull up the potential $V_{N2}$ at the node N2 in accordance with a relation between the power-supply potential VDDA and the power-supply potential VDDB.

Based on this concept, the level shift circuit 1j further includes a control circuit 40j. The control circuit 40j turns on the null-up switch PSW1 and the pull-up switch PSW2 in accordance with a potential difference between the power-supply potential VDDA and the power-supply potential VDDB. The control circuit 40j turns on the pull-up switch PSW1 and the pull-up switch PSW2 in accordance with the potential difference between the power-supply potential VDDA and the power-supply potential VDDB being smaller than a threshold (for example, in a case where "power-supply potential VDDA<power-supply potential VDDB" and "VDDB-VDDA<VthP" are established). The control circuit 40j turns off the pull-up switch PSW1 and the pull-up switch PSW2 in accordance with the potential difference between the power-supply potential VDDA and the power-supply potential VDDB being larger the threshold (for example, in a case where "power-supply potential VDDA<power-supply potential VDDB" and "VDDB-VDDA>VthP" are established).

Specifically, the control circuit 40j includes a potential-difference detector 41j. The potential-difference detector 41j starts an operation before a timing immediately before rising of the first clock of the input clock φCK. The potential-difference detector 41j receives a bias potential VBN, and detects the potential difference between the power-supply potential VDDA and the power-supply potential VDDB by using the bias potential VBN.

The potential-difference detector 41j outputs a signal of L level (pull-up ON) as a voltage signal $V_{N11}$ from the node N11 continuously, if "VDDB-VDDA<VthP" is established. In response to this output, both the PMOS transistors PM31 and PM32 are turned on, and are maintained to be in an on state in a time period during which the voltage signal $V_{N11}$ is at an L level. Therefore, the potential at each of the nodes N2 and N5 is pulled up to an H level corresponding to the power-supply potential VDDB.

The potential-difference detector 41j outputs a signal of H level (pull-up OFF) as the voltage signal $V_{N11}$ from the node N11 continuously, if "VDDB-VDDA>VthP" is established. In response to this output, both the PMOS transistors PM31 and PM32 are turned off, and are maintained to be in an off state in a time period during which the voltage signal $V_{N11}$ is at an H level. Therefore, the potentials at the nodes N2 and N1 are not pulled up.

Figure 10:
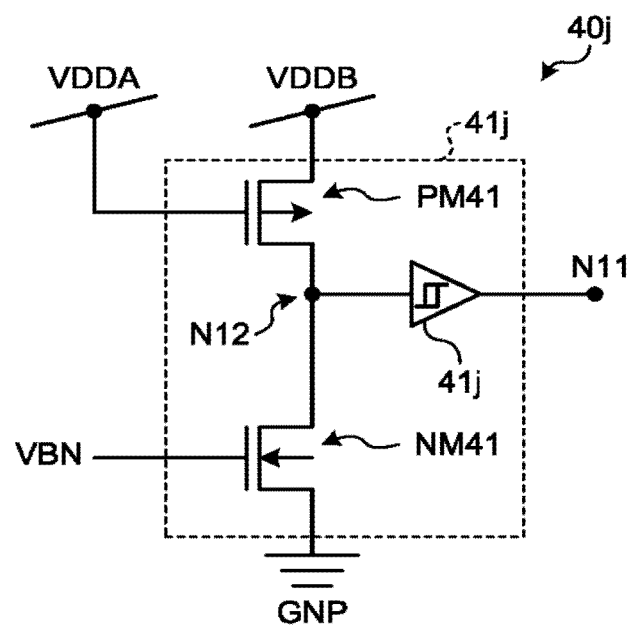
FIG. 10 is a circuit diagram illustrating a configuration of a control circuit according to the fourth embodiment.

The potential-difference detector 41j in the control circuit 40j is configured as a circuitry as illustrated in FIG. 10, for example. FIG. 10 is a circuit diagram illustrating a configuration of the control circuit 40j according to the fourth embodiment. The potential-difference detector 41j in the control circuit 40j includes a PMOS transistor PM41, an NMOS transistor NM41, and a schmitt trigger 41j.

The PMOS transistor PM41 and the NMOS transistor NM41 are electrically inserted between the power-supply potentials VDDA and VDDB and the ground potential GND. The PMOS transistor PM41 is connected to the power-supply potential VDDA at a gate, to the power-supply potential VDDB at a source, and to a node N12 at a drain. The NMOS transistor NM41 is connected to the bias potential VBN at a date, to the ground potential GND at a source, and to the node N12 at a drain. The schmitt trigger 41j is electrically inserted between the node N12 between the PMOS transistor PM41 and the NMOS transistor NM41, and the node N11. The schmitt trigger 41j is connected to the node N12 at an input node and to the node N11 at an output node. That is, the drain of the PMOS transistor PM41 and the drain of the NMOS transistor NM41 are electrically connected.

The schmitt trigger 41j has an effect of preventing erroneous determination by a detector caused by power-supply noise, by changing a circuit threshold for L→H and H→L.

Figure 11:
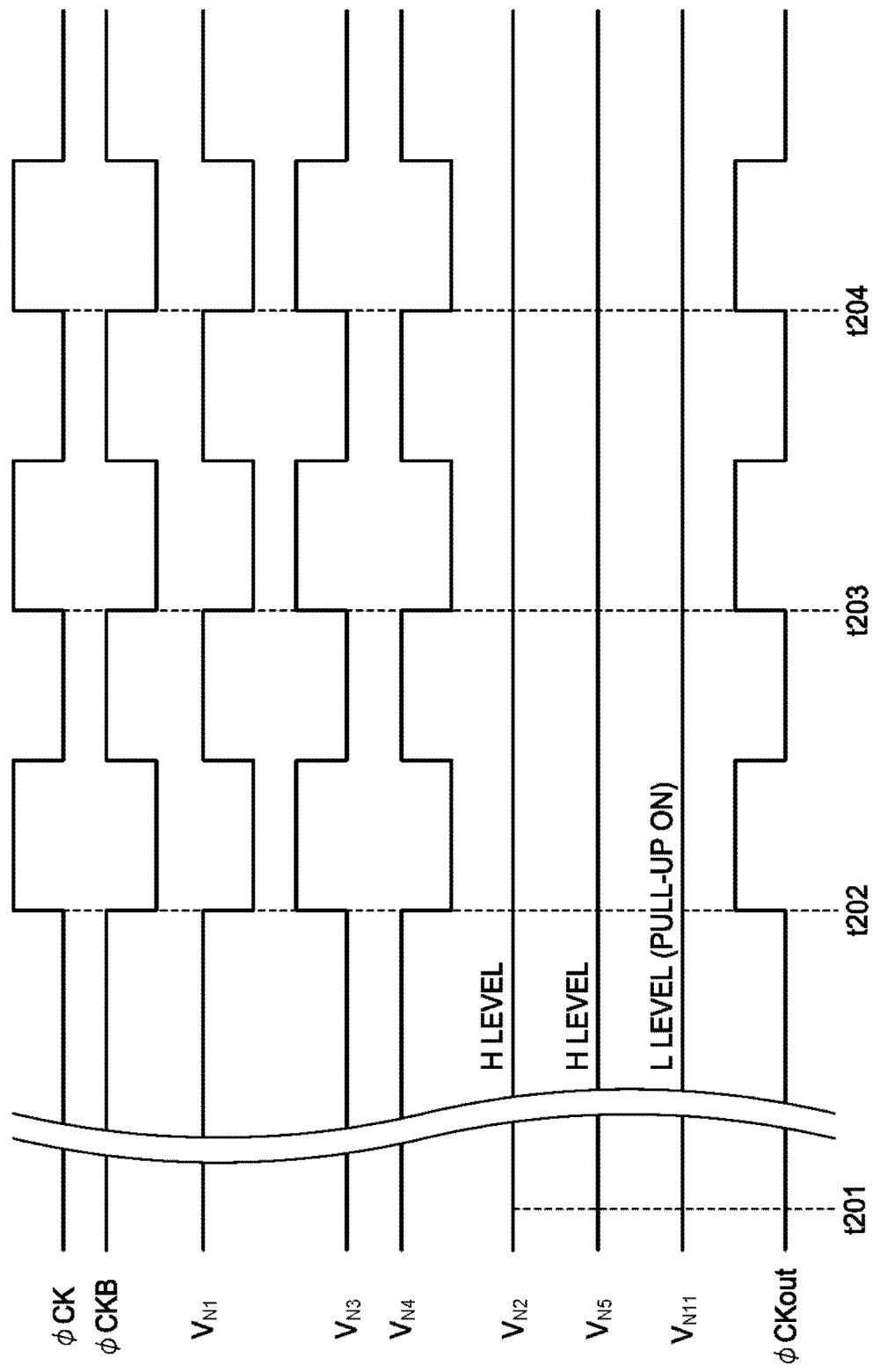
FIG. 11 is a waveform chart illustrating an operation of the level shift circuit according to the fourth embodiment.

At this time, the level shift circuit 1j operates as illustrated in FIG. 11, for example. FIG. 11 is waveform chart illustrating an operation of the level shift circuit 1j according to the fourth embodiment, which illustrates an operation in a case where "VDDB-VDDA<VthP" is established as an example.

At a timing t201 before a rising timing t202 of the first clock of the input clock ϕCK, the potential-difference detector 41j in the control circuit 40j detects that "VDDB-VDDA<VthP" is established, and continuously outputs the voltage signal $V_{N11}$ that is at an L level to the node N11 in accordance with the detection. Therefore, the pull-up switches PSW1 and PSW2 in the pull-up circuit 30j maintain an on state and pull up the nodes N2 and N5, respectively. Consequently, the potentials $V_{N2}$ and $V_{N5}$ at the nodes N2 and N5 are pulled up towards the power-supply potential VDDB, and are stable F-level potentials.

Because the potentials $V_{N2}$ and $V_{N5}$ at the nodes N2 and N5 are stable at the H level at the timing t202, it is possible to make rising of the output clock ϕCKout at a transition of the clock ϕCK from an L level to an H level quicker. Consequently, the duty of the first clock of the output clock ϕCKout can be improved.

Thereafter, even when leak, a gate voltage value, or the like of the PMOS transistor PM2 exists, the potential at the node N2 can be maintained at the H level stably because the pull-up switches PSW1 and PSW2 pull up the nodes N2 and N5, respectively.

Because the potentials $V_{N2}$ and $V_{N5}$ at the nodes N2 and N5 are stable at the H level also at a timing t203, it is possible to make rising of the output clock ϕCKout at a transition of the clock ϕCK from the L level to the H level quicker. Consequently, the duty of the second clock of the output clock ϕCKout can be improved.

An operation for the third clock and subsequent clocks of the clock ϕCK (for example, an operation at a timing t204) is identical to the operation for the second clock of the clock ICK (that is, the operation at the timing t203). Further, the potentials $V_{N1}$, $V_{N3}$, and $V_{N4}$ at the nodes N1, N3, and N4 are changed in a stable manner, as illustrated in FIG. 11.

Figure 12:
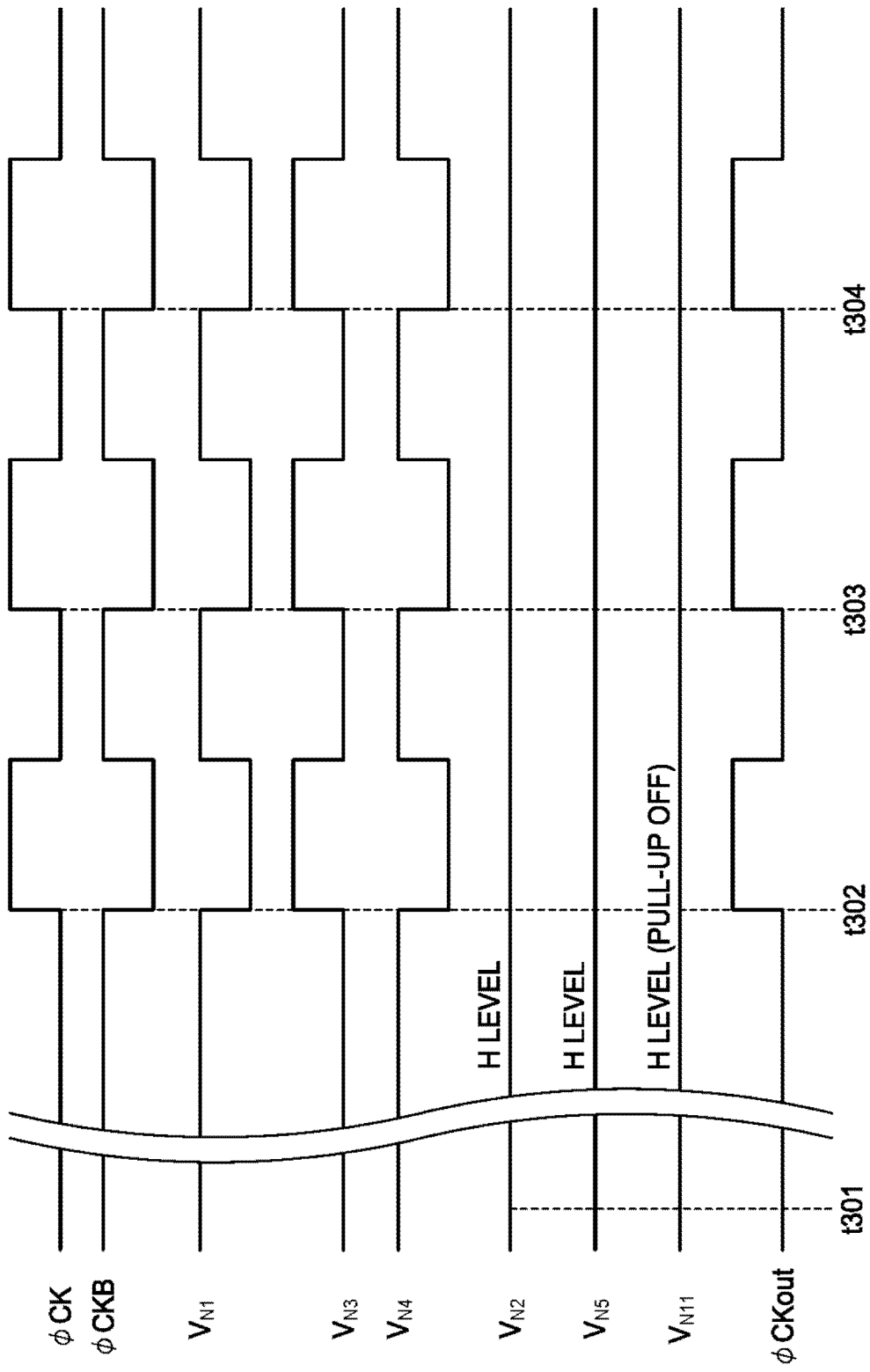
FIG. 12 is a waveform chart illustrating another operation of the level shift circuit according to the fourth embodiment.

Alternatively, the level shift circuit 1j operates as illustrated in FIG. 12, for example. FIG. 12 is a waveform chart illustrating another operation of the level shift circuit 1j according to the fourth embodiment, which illustrates an operation in a case where "VDDB-VDDA>VthP" is established as an example.

At a timing t301 before a rising timing t302 of the first clock of the input clock ϕCK, the potential-difference detector 41j in the control circuit 40j detects that "VDDB-VDDA>VthP" is established, and continuously outputs the voltage signal $V_{N11}$ that is at an H level to the node N11 in accordance with the detection. Therefore, although the pull-up switches PSW1 and PSW2 in the pull-up circuit 30j maintain an off state and do not pull up the nodes N2 and N5, respectively, the PMOS transistor PM2 can secure a potential difference between a gate and a source sufficiently and is in an on state, and the node N2 is at a stable H-level potential. In accordance with the potential at the node N2, the node N5 is at a stable H-level potential.

Because the potentials $V_{N2}$ and $V_{N5}$ at the nodes N2 and N5 are stable at the H level at the timing t302, it is possible to make rising of the output clock ϕCKout at a transition of the clock ϕCK from an L level to an H level quicker. Consequently, the duty of the first clock of the output clock ϕCKout can be improved.

Thereafter, because the PMOS transistor PM2 can secure the potential difference between the gate and the source sufficiently and is in an off state stably, the potential at the node N2 can be maintained at the H level stably.

Because the potentials $V_{N2}$ and $V_{N5}$ at the nodes and N5 are stable at the H level at a timing t303, it is possible to make rising of the output clock ϕCKout at a transition of the clock ϕCK from an L level to an H level quicker. Consequently, the duty of the second clock of the output clock ϕCkout can be improved.

An operation for the third clock and subsequent clocks of the clock ϕCK (for example, an operation at a timing t304) is identical to the operation for the second clock of the clock ϕCK (that is, the operation at the timing t303). Further, the potentials $V_{N1}$, $V_{N3}$, and $V_{N4}$ at the nodes N1, N3, and N4 are changed in a stable manner, as illustrated in FIG. 12.

Figure 13:
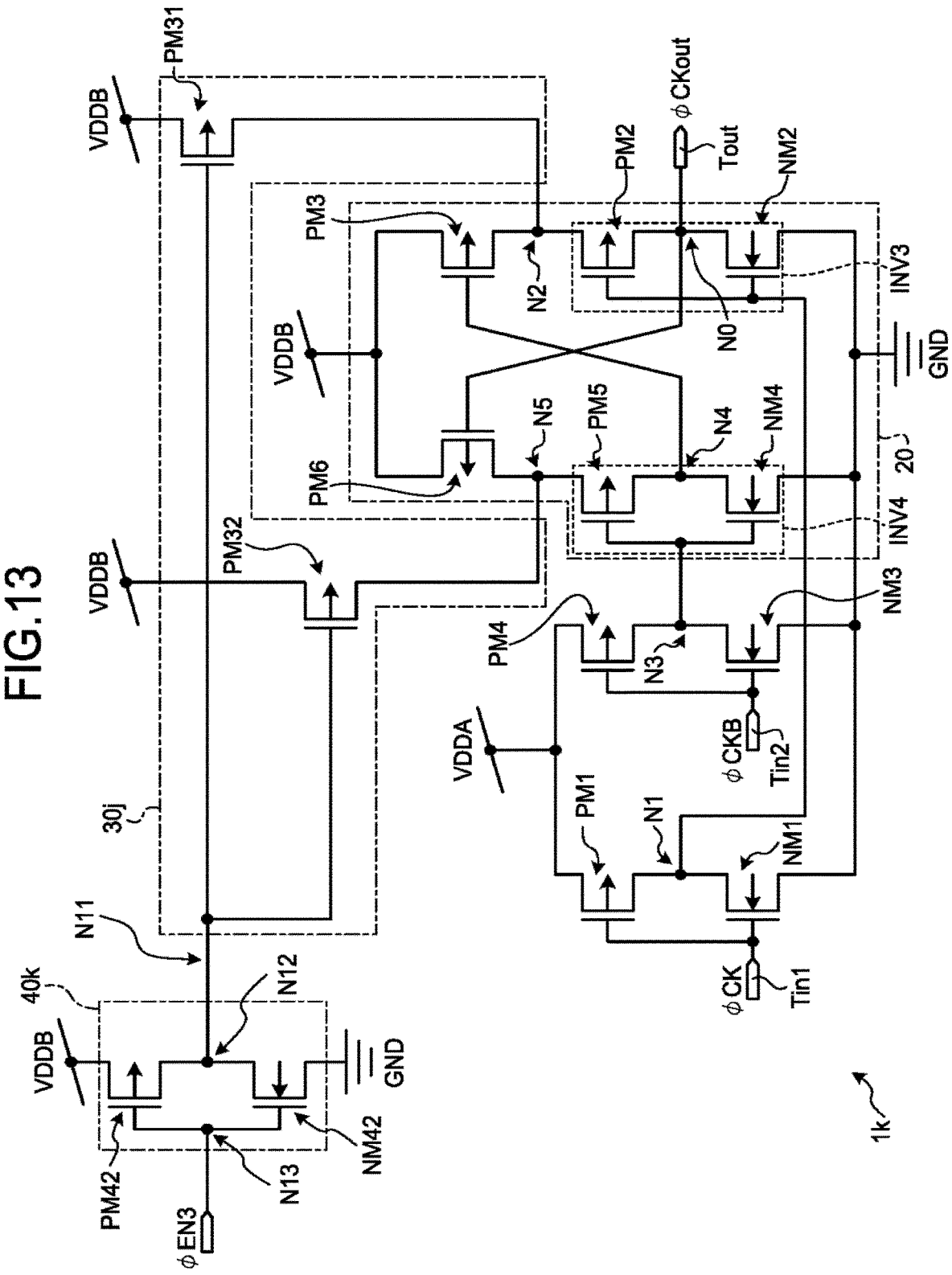
FIG. 13 is a circuit diagram illustrating a configuration of a level shift circuit according to a fifth embodiment.

Alternatively, a control circuit 40k that has a simplified configuration as compared with the control circuit 40j illustrated in FIGS. 9 and 10, can be provided as illustrated in FIG. 13. FIG. 13 is a circuit diagram illustrating a configuration of a level shift circuit according to a fifth embodiment. A relation between the power-supply potential VDDA and the power-supply potential VDDB is predetermined, and can be applied in a case where external control can be performed.

Based on this concept, the control circuit 40k includes a PMOS transistor PM42 and an NMOS transistor NM42 in place of the PMOS transistor PM41, the NMOS transistor NM41, and the schmitt trigger 41j (see FIG. 10). The PMOS transistor PM42 and the NMOS transistor NM42 are inverter-connected, and are electrically inserted between the power-supply potential VDDB and the ground potential GND. The PMOS transistor PM42 is connected to a node N13 at a gate, to the power-supply potential VDDB at a source, and to the node N12 at a drain. The NMOS transistor NM42 is connected to the node N13 at a gate, to the ground potential GND at a source, and to the node N12 at a drain. That is, the drain of the PMOS transistor PM42 and the drain of the NMOS transistor NM42 are electrically connected. To the node N13, a control signal φEN3 is supplied from outside. The control signal φEN3 is generated outside to maintain an L level in a time period during which "VDDB-VDDA>VthP" is established and maintain an H level in a time period during which "VDDB-VDDA<VthP" is established, and can be supplied to the control circuit 40k. To the node N12, a signal obtained by inverting the polarity of the control signal φEN3 supplied to the node N13 is output.

Also with this configuration, the control circuit 40k can continuously output a signal of L level (pull-up ON) as the voltage signal $V_{N11}$ from the node N11 if "VDDB-VDDA<VthP" is established, and can continuously output a signal of H level (pull-up OFF) as the voltage signal $V_{N11}$ from the node N11 if "VDDB-VDDA>VthP" is established. Further, because the control circuit 40k that has a simplified configuration as compared with the control circuit 40j illustrated in FIGS. 9 and 10 is provided, a circuit area of the control circuit 40k can be reduced.

In a level shift circuit 1k illustrated in FIG. 13, in a case where "power-supply potential VDDA<power-supply potential VDDB" and "VDDB-VDDA<VthP" are established, the PMOS transistor PM2 receiving at the gate the voltage signal $V_{N1}$, which is at an H level in an initial state, cannot secure a sufficient potential difference between the gate and the source, and is in an imperfect off state (a weak on state). In this case, there is a concern that when the NMOS transistor NM2 constituting the inverter INV3 together with the PMOS transistor PM2 is in an ON state, a leak current increases because of the imperfect off state of PM2.

Figure 14:
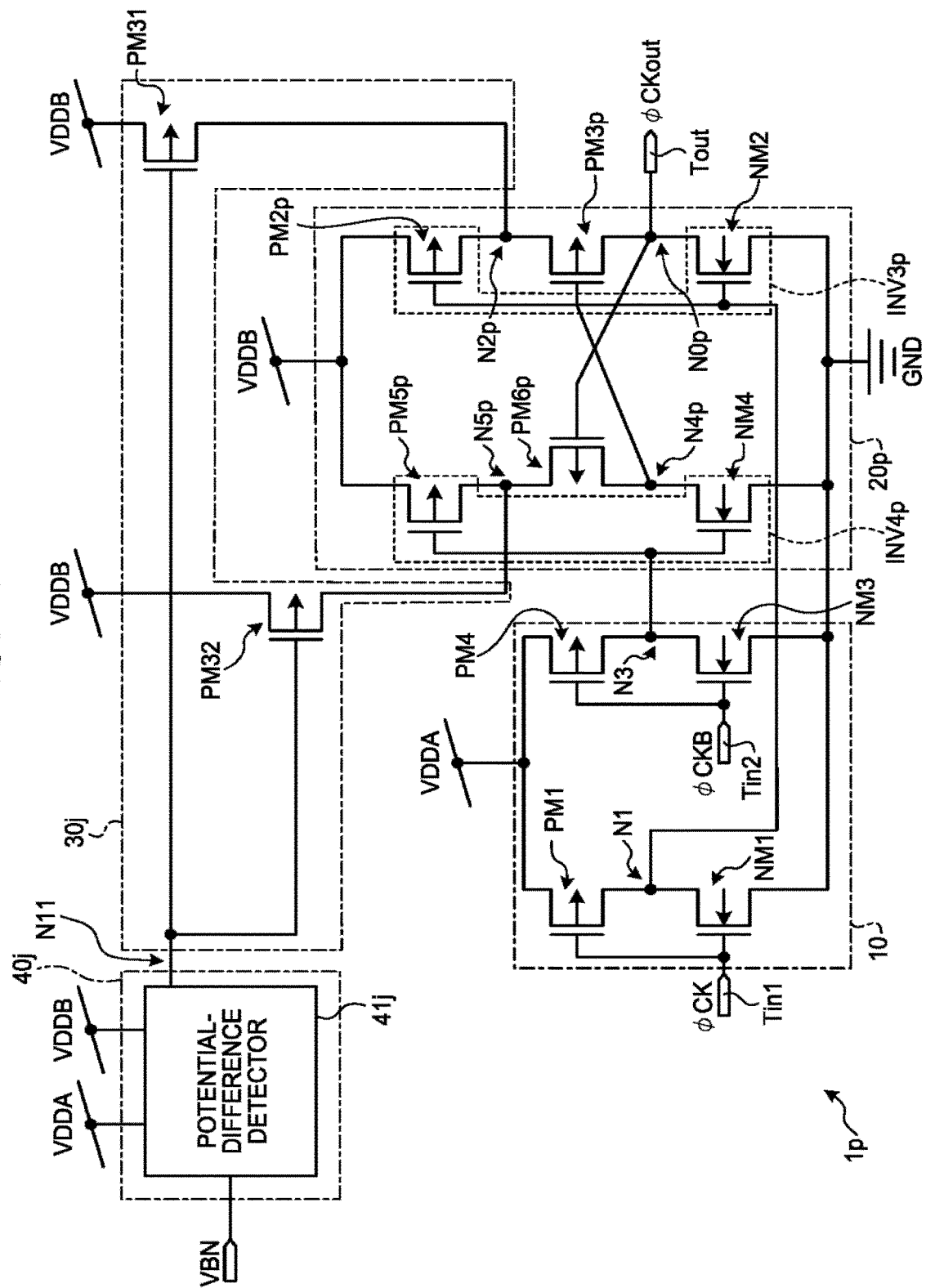
FIG. 14 is a circuit diagram illustrating a configuration of a level shift circuit according to a sixth embodiment.

In order to reduce the leak current, a level shift circuit 1p can be configured as illustrated in FIG. 14, for example. FIG. 14 is a diagram illustrating a configuration of the level shift circuit 1p according to a sixth embodiment. The level shift circuit 1p includes a level shifter 20p in place of the level shifter 20 (see FIG. 9). In the level shifter 20p, connection positions of a PMOS transistor PM2p and a PMOS transistor PM3p are switched with each other and connection positions of a PMOS transistor PM5p and a PMOS transistor PM6p are switched with each other, with respect to the level shifter 20 (see FIG. 9). That is, the PMOS transistor PM3p is electrically inserted between the PMOS transistor PM2p and the NMOS transistor NM2 in an inverter INV3p, and the PMOS transistor PM6p is electrically inserted between the PMOS transistor PM5p and the NMOS transistor NM4 in an inverter INV4p.

In the inverter INV3p, the PMOS transistor PM2p is connected to the node N1 at a gate, to the power-supply potential VDDB at a source, and to a node N2p at a drain. The PMOS transistor PM3p is connected to a node N4p at a gate, to the node N2p at a source, and to a node N0p at a drain. That is, the drain of the PMOS transistor PM2p and the source of the PMOS transistor PM3p are electrically connected. Further, in the inverter INV4p, the PMOS transistor PM5p is connected to the node N3 at a gate, to the power-supply potential VDDB at a source, and to a node N5p at a drain. The PMOS transistor PM6p is connected to the node N0p at a gate, to the node N5p at a source, and to the node N4p at a drain. That is, the drain of the PMOS transistor PM5p and the source of the PMOS transistor PM6p are electrically connected.

Therefore, it is possible to surely turn off the PMOS transistors PM3p and PM6p that are connection partners of cross-coupling connection for the inverters INV3p and INV4p at a potential of VDDB and to reduce a leak current.

Figure 15:
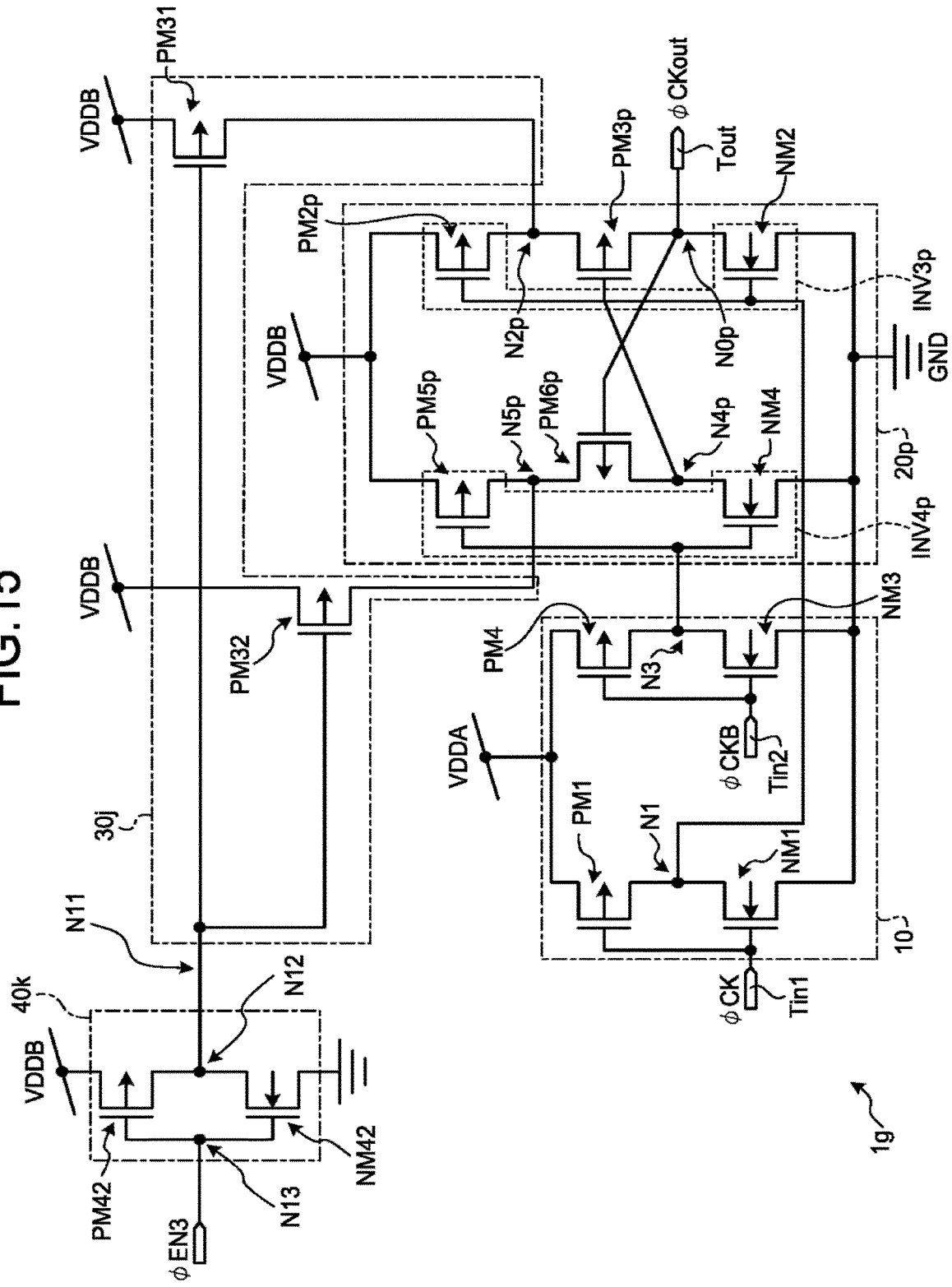
FIG. 15 is a circuit diagram illustrating configuration of a level shift circuit according to a seventh embodiment.

Alternatively, the control circuit 40k that has a simplified configuration as compared with the control circuit 40j illustrated in FIGS. 9 and 10, can be provided as illustrated in FIG. 15. FIG. 15 is a circuit diagram illustrating a configuration of a level shift circuit 1g according to a seventh embodiment. The level shift circuit 1g includes the control circuit 40k in place of the control circuit 40j (see FIG. 14). The control circuit 40k includes the PMOS transistor PM42 and the NMOS transistor NM42 in place of the PMOS transistor PM41, the NMOS transistor NM41, and the schmitt trigger 41j (see FIG. 10). The PMOS transistor PM42 and the NMOS transistor NM42 are inverter-connected, and are electrically inserted between the power-supply potential VDDB and the ground potential GND. The PMOS transistor PM42 is connected to the node N13 at a gate, to the power-supply potential VDDB at a source, and to the node N12 at a drain. The NMOS transistor NM42 is connected to the node N13 at a gate, to the ground potential GND at a source, and to the node N12 at a drain. To the node N13, the control signal φEN3 is supplied from outside (a host or a core). The control signal φEN3 is generated outside to maintain an L level in a time period during which "VDDB-VDDA>VthP" is established and maintain an H level in a time period during which "VDDB-VDDA<VthP" is established, and can be supplied to the control circuit 40k.

Also with this configuration, the control circuit 40k can continuously output a signal of L level (pull-up ON) as the voltage signal $V_{N11}$ from the node N11 if "VDDB-VDDA<VthP" is established, and can continuously output a signal of H level (pull-up OFF) as the voltage signal $V_{N11}$ from the node N11 if "VDDB-VDDA>VthP" is established. Further, because the control circuit 40k that has a simplified configuration as compared with the control circuit 40j illustrated in FIGS. 9 and 10 is provided, a circuit area of the control circuit 40k can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A level shift circuit comprising:
   a first PMOS transistor electrically connected at a gate to a first node to which a first signal having an amplitude to be a first power-supply potential is input, electrically connected to a second node at a source, and electrically connected at a drain to an output terminal from which a signal having an amplitude to be a second power-supply potential different from the first power-supply potential is output;
   a first NMOS transistor electrically connected to the first node at a gate and is electrically connected to the output terminal at a drain;
   a second PMOS transistor electrically connected to a third node at a gate, electrically connected to a node to be the second power-supply potential at a source, and electrically connected to the second node at a drain;

a third PMOS transistor electrically connected at a gate to a fourth node to which a second signal having an amplitude to be the first power-supply potential and being logical inversion of the first signal is input, electrically connected to a fifth node at a source, and electrically connected to the third node at a drain;
a second NMOS transistor electrically connected to the fourth node at a gate and electrically connected to the third node at a drain;
a fourth PMOS transistor electrically connected to the output terminal at a gate, electrically connected to the node to be the second power-supply potential at a source, and electrically connected to the fifth node at a drain; and
a potential adjusting circuit that is electrically connected to at least the second node, and
wherein the potential adjusting circuit is a charging circuit electrically connected to the second node,
the charging circuit includes a switch electrically inserted between the node to be the second power-supply potential and the second node,
the switch is maintained to be in an on state in a first time period from before a first timing at which the output terminal transitions from a first level to a second level to the first timing, and is maintained to be in an off state in a second time period following the first time period.

2. The level shift circuit according to claim 1, wherein the switch is maintained to be in an on state in a third time period from before a second timing which is after the first timing and at which the output terminal transitions from the first level to the second level to the second timing, and is maintained to be in an off state in a fourth time period following the third time period.

3. The level shift circuit according to claim 1, further comprising
a pulse generator electrically connected to a control node of the switch.

4. The level shift circuit according to claim 3, wherein the pulse generator comprises
a logic circuit that includes a first input node and a second input node,
a line connected to the first input node, and
a delay line that is connected to the second input node and includes a delay element and a MOS transistor serving as a load capacitance.

5. The level shift circuit according to claim 1, wherein a voltage corresponding to the second power-supply potential is supplied to the second node via the switch.

6. The level shift circuit according to claim 1, wherein the potential adjusting circuit is a pull-up circuit electrically connected to the second node and the fifth node.

7. The level shift circuit according to claim 6, wherein the pull-up circuit comprises
a first pull-up switch electrically inserted between the node to be the second power-supply potential and the second node, and
a second pull-up switch electrically inserted between the node to be the second power-supply potential and the fifth node.

8. The level shift circuit according to claim 7, further comprising
a control circuit configured to turn on the first pull-up switch and the second pull-up switch in accordance with a potential difference between the first power-supply potential and the second power-supply potential.

9. The level shift circuit according to claim 8, wherein the control circuit is configured to turn on the first pull-up switch and the second pull-up switch in accordance with the potential difference between the first power-supply potential and the second power-supply potential being smaller than a threshold.

10. The level shift circuit according to claim 9, wherein the control circuit is configured to turn off the first pull-up switch and the second pull-up switch in accordance with the potential difference between the first power-supply potential and the second power-supply potential being larger than the threshold.

11. The level shift circuit according to claim 1, wherein the second power-supply potential is higher than the first power-supply potential.

12. A level shift circuit comprising:
a first PMOS transistor electrically connected at a gate to a first node to which a first signal having an amplitude to be a first power-supply potential is input, electrically connected to a node to be a second power-supply potential at a source, and electrically connected to a second node at a drain;
a first NMOS transistor electrically connected to the first node at a gate and electrically connected at a drain to an output terminal from which a signal having an amplitude to be a second power-supply potential different from the first power-supply potential is output;
a second PMOS transistor electrically connected to a third node at a gate, electrically connected to the second node at a source, and electrically connected to the output terminal at a drain;
a third PMOS transistor electrically connected at a gate to a fourth node to which a second signal having an amplitude to be the first power-supply potential and being logical inversion of the first signal is input, electrically connected to the node to be the second power-supply potential at a source, and electrically connected to a fifth node at a drain;
a second NMOS transistor electrically connected to the fourth node at a gate and electrically connected to the third node at a drain;
a fourth PMOS transistor electrically connected to the output terminal at a gate, electrically connected to the fifth node at a source, and electrically connected to the third node at a drain; and
a potential adjusting circuit that is electrically connected to the second node and the fifth node.

13. The level shift circuit according to claim 12, wherein the potential adjusting circuit is a pull-up circuit that pulls up a potential at the second node and pulls up a potential at the fifth node.

14. The level shift circuit according to claim 13, wherein the pull-up circuit comprises
a first pull-up switch electrically inserted between the node to be the second power-supply potential and the second node, and
a second pull-up switch electrically inserted between the node to be the second power-supply potential and the fifth node.

15. The level shift circuit according to claim 14, further comprising
a control circuit configured to turn on the first pull-up switch and the second pull-up switch in accordance with a potential difference between the first power-supply potential and the second power-supply potential.

16. The level shift circuit according to claim 15, wherein the control circuit is configured to turn on the first pull-up switch and the second pull-up switch in accordance with the potential difference between the first power-supply potential and the second power-supply potential being smaller than a threshold.

17. The level shift circuit according to claim 16, wherein the control circuit is configured to turn off the first pull-up switch and the second pull-up switch in accordance with the potential difference between the first power-supply potential and the second power-supply potential being larger than the threshold.

\* \* \* \* \*